US006720791B2

(12) United States Patent
Cheng et al.

(10) Patent No.: US 6,720,791 B2
(45) Date of Patent: Apr. 13, 2004

(54) LCD TESTING METHOD

(75) Inventors: Jia-Shyong Cheng, Hsinchu Hsien (TW); Chia-Yu Wang, Taipei (TW); Shing-shiang Chang, Kaohsiung (TW)

(73) Assignee: Hannstar Display Corporation, Taipei (TW)

( * ) Notice: Subject to any disclaimer, the term of this patent is extended or adjusted under 35 U.S.C. 154(b) by 40 days.

(21) Appl. No.: 09/940,288

(22) Filed: Aug. 27, 2001

(65) Prior Publication Data

US 2002/0063574 A1 May 30, 2002

(30) Foreign Application Priority Data

Nov. 24, 2000 (TW) ....................................... 89124995 A

(51) Int. Cl.[7] ................................................ G01R 31/00
(52) U.S. Cl. .................... 324/770; 324/73.1; 324/158.1
(58) Field of Search ................................ 324/770, 73.1, 324/158.1; 349/73, 192, 74; 345/904, 905

(56) References Cited

U.S. PATENT DOCUMENTS 5,657,139 A 8/1997 Hayashi
6,437,596 B1 * 8/2002 Jenkins et al. .............. 324/770

* cited by examiner

*Primary Examiner*—Kamand Cuneo
*Assistant Examiner*—Paresh Patel
(74) *Attorney, Agent, or Firm*—Rabin & Berdo, P.C.

(57) ABSTRACT

An LCD panel testing method. The method comprises forming jump lines in a predetermined region on the substrate between the signal lines via mask design when forming TFT LCD arrays, and thus forming a plurality of signal-line groups each with two signal lines coupled by the jump lines. Thereupon, an array tester sequentially tests two pixels corresponding to the signal lines in the signal groups. If one of the feedback signals from the signal groups does not meet a predetermined standard, it is determined that one or both pixels in the signal group are defective. The defective pixel or pixels are then identified using an electronic microscope to test two pixels at the same time. In this way, the number of probe pins and tests performed is halved. The probe pin size is also thus less restrictive due to larger probe pin intervals. Consequently, yield is greatly increased.

8 Claims, 5 Drawing Sheets

LCD TESTING METHOD

BACKGROUND OF THE INVENTION

1. Field of the Invention

The present invention relates in general to an LCD testing method. In particular, the present invention relates to an LCD testing method reducing the testing time and increasing yield.

2. Description of the Related Art

New technologies have made thin-film-transistor liquid-crystal-display (TFT LCD) units with higher resolution and larger panel size highly accessible. TFT-LCDs with resolution higher than 1224×768 and panels larger than 14 inches (such as XGA and SXGA specifications) have become standard for notebook computers. As technology advances, quality control has become a crucial concern. The quality of the LCD is largely concerned with pixel output, affected by broken circuits, current leakage of the TFT and parasitic capacitance.

A typical testing method to assess the likelihood of these problems occurring is the charge-coupled-device (CCD) captured image match method. First, the panel is lit by an optical system. The pixel image on the panel is then captured with the CCD and transformed to digital signals that are then analyzed. Defective pixels are thus detected.

Another testing method frequently used is to connect an array tester to the signal lines and gate lines on a substrate of a TFT-LCD. The array tester sequentially transmits predetermined signals to the signal lines or gate lines, then sequentially receives and analyzes the signals fed back by the signal lines or gate lines to locate the defective pixels. Array testers such as the IBM array tester use probe tips to contact the outer pin of each signal or gate line and transmit the predetermined signals to the signal or gate lines. The signals fed back from the signal or gate lines are then analyzed as IV curves using components such as integrators. If any IV curve does not match the predetermined standard, the existence of defective pixels is determined, and subsequently identified using an apparatus such as an electronic microscope. FIG. 1 shows the signal lines in an LCD array. Notation 100 represents the overall LCD signal lines in a manufacturing process. Each signal line comprises a first end 1, a second end 2 and a periphery bonding pad 3. The first end 1 and the second end 2 respectively have electro-static-discharge (BSD) protection devices to protect the LCD from ESD events. The second end 2 is usually trimmed off after the manufacturing process is completed. The array tester is connected to the pad 3 to carry out the test against the LCD array pixels together with cooperation of the gate lines (not shown).

Some limits exist, however, to the testing method described above. The pin 10 process technology is one concern. Using an LCD in XGA specification as an example, there are 768 gate lines, and 3072 (=1024×3) signal lines (each pixel unit is comprised of the 3 pixel dots of R, G and B). To carry out the test, the probe tips must precisely contact the outer pin of the gate lines and the signal lines (the PAD). When the resolution increases, the accuracy of the pins and the apparatus rectifying the probe tips touching the outer pins must increase. Furthermore, the higher pixel count in larger LCDs also requires more time to be tested. For example, an LCD in the above specification contains 2359296 pixels (3072×768) which will take a considerable amount of time to test. Testing times have a major effect on manufacturing costs. With good quality control, if the testing time is efficiently reduced, the yield will improve considerably. When LCD manufacturing technology has achieved a certain yield rate, the chance of any two non-defective pixels on the panel occurring is considerable. Therefore, the testing method should not be limited to the conventional one-by-one mode. The conventional method neglects the ability of the array testers to test two pixels at any given time.

SUMMARY OF THE INVENTION

An object of the present invention is to provide an LCD testing method. The method comprises forming jump lines in a predetermined region on the substrate between the signal lines via mask design when forming TFT LCD arrays, thus forming a plurality of signal-line groups, each with two signal lines coupled by the jump lines. Thereupon, an array tester sequentially tests two pixels corresponding to the signal lines in the signal groups. When a feedback signal from the signal groups does not meet a predetermined standard, it is determined that one or both pixels in the signal group are defective. The defective pixel or pixels are then identified using an optical apparatus such as an electronic microscope. The optical apparatus has a scope covering two pixel units to test two pixels at the same time. Therefore, the numbers of the probe pins and the tests carry carried out is halved. The probe pin size is thus less restrictive due to larger probe pin intervals. Consequently, the yield is greatly increased. After the manufacturing process, the predetermined region is trimmed off to re-establish the separation of the signal lines.

More specifically, the present invention provides an LCD panel testing method for testing a plurality of pixel units in an LCD panel having a plurality of corresponding gate lines and n signal lines $Pi\sim P_n$. The method comprises: providing a substrate; providing an LCD panel on the substrate, having the signal lines $Pi\sim P_n$ sequentially arranged on one side of the LCD panel; dividing the signal lines $Pi\sim P_n$ to form a plurality of signal-line groups, each signal-line group comprising at least two of the signal lines; providing a sacrifice area on the substrate to couple the signal lines in the signal-line groups; and providing a testing device having a plurality of first probe tips and a plurality of second probe tips, wherein the first probe tips are respectively coupled to the gate lines, and the second probe tips are respectively coupled to the signal-line groups so that the testing device sequentially tests the pixel units corresponding to one of the gate lines and one of the signal-line groups. After the testing device has finished testing all the pixel units, the sacrifice area is trimmed off from the substrate with a trimmer to re-establish the separation of the signal lines. If any of the signal lines are not assigned to the signal-line groups, the pixel units on the unassigned signal lines are sequentially tested with one of the first probe tips and one of the second probe tips.

The method of dividing the signal lines $P_l\sim P_n$ into a plurality of signal-line groups can be any of the following: (1) putting the signal lines $P_{6i+j}$ and $P_{6i+j+3}$ into a signal-line group, wherein i and j are integers, and $0\leqq i\leqq n/6$, $1\leqq j\leqq 3$. (2)

1. putting the signal lines $P_{2i+1}$ and $P_{2i+2}$ into a signal-line group, wherein i is an integer, and $0\leqq i\leqq n/6$, $1\leqq j\leqq 3$. Or (3) putting the signal lines $P_{4i+j}$ and $P_{4i+j+2}$ into a signal-line group, wherein i and j are integers, and $0\leqq i\leqq n/4$, $1\leqq j\leqq 2$. The testing device comprises an LCD array tester, electronic microscope, CCD captured image matching system or other conventional instruments.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

Figure 1:
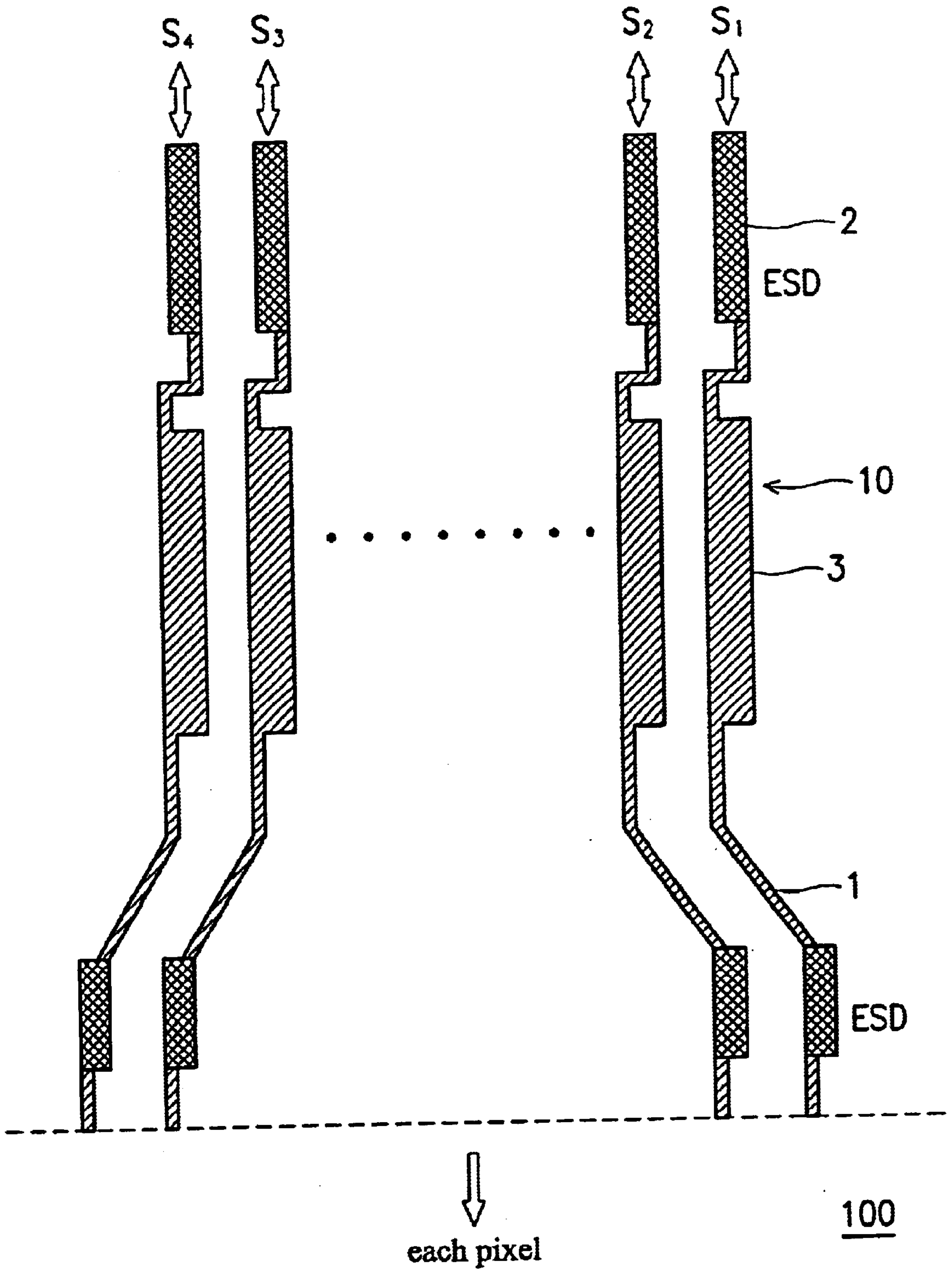
FIG. 1 ( PRIOR ART )
FIG. 1 is a perspective diagram of conventional signal lines on the LCD panel to be tested.
Figure 2:
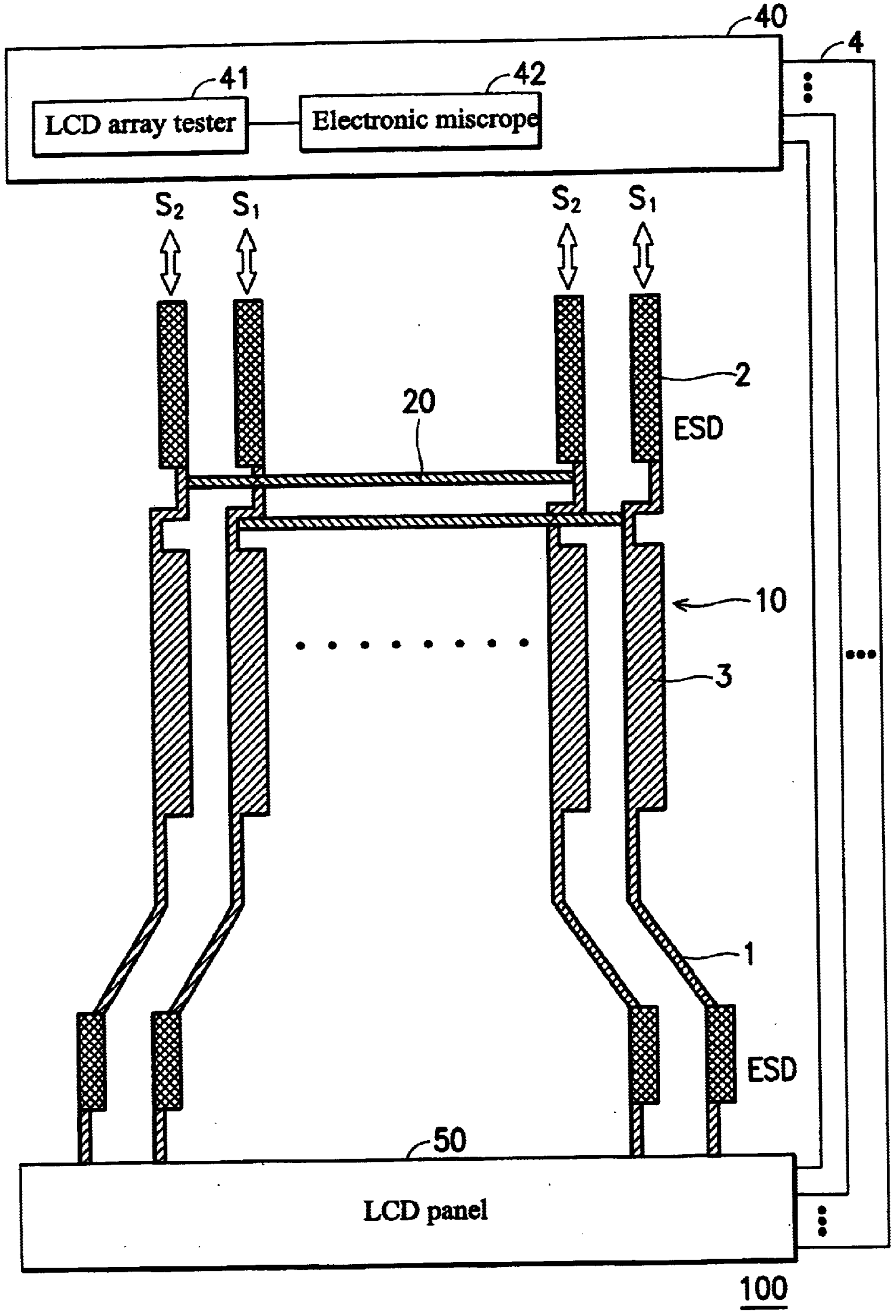
FIG. 2 is a perspective diagram of the configuration of the signal lines according to the present invention.
Figure 3:
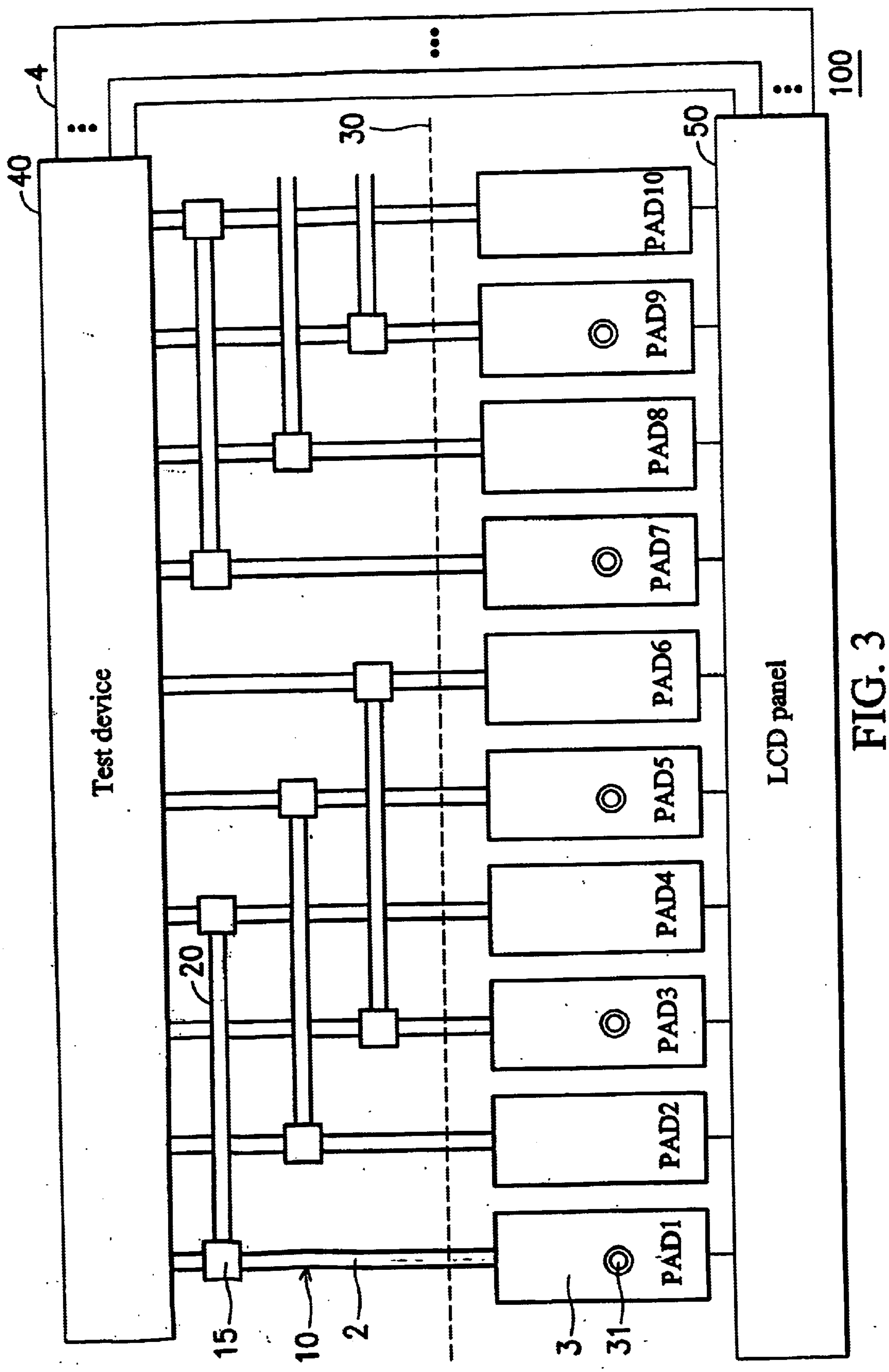
FIG. 3 shows the first embodiment of the configuration of the signal lines according to the present invention.
Figure 4:
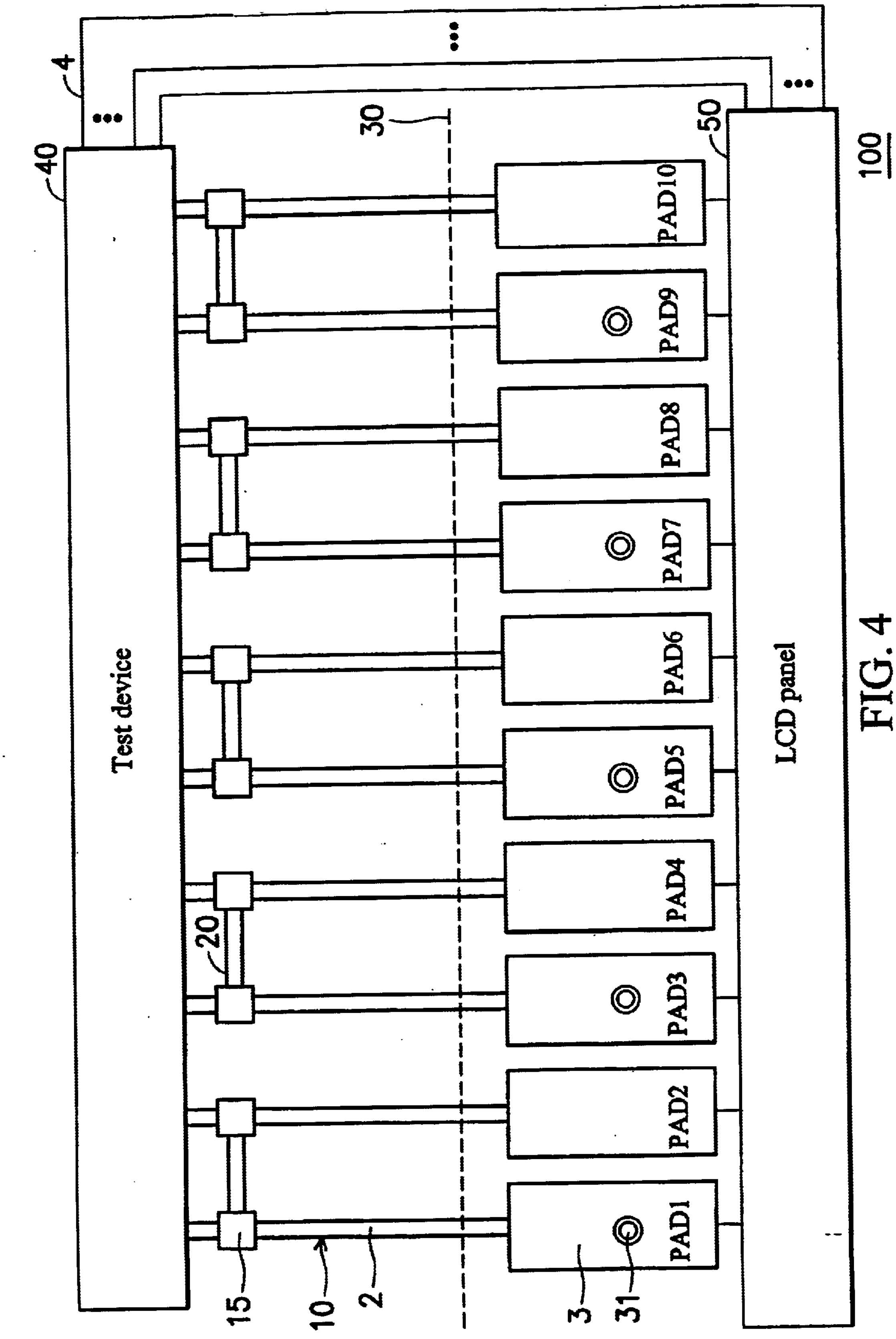
FIG. 4 shows the second embodiment of the configuration of the signal lines according to the present invention.

Referring to FIG. 2, jump lines 20 are used to couple the signal lines 10 in FIG. 1. Every two coupled signal lines 10 are referred to as a signal-line group, which transmits a signal (such as S1 or S2 in FIG. 2). If neither pixel in a signal-line group is defective, the feedback signal from the signal-line group will approximately fall within a predetermined range. Conversely, if one or both of the pixels in the signal-line group are defective, the feedback signal (such as S1 or S2) from the signal-line group will not fall within the predetermined range. The defective pixel or pixels are identified using an optical apparatus such as an electronic microscope 42 with a scope covering two pixel units. The jump lines 20 are formed together with the LCD panel on the substrate by sequential lithography and etching. The jump lines 20 are preferably formed in a certain region on the substrate referred to as the sacrifice area, removed (by trimming) after the test to re-establish the separation of the signal lines. This is similar to electro-static discharge (ESD) protection in a panel manufacturing-process. The ESD protection devices are usually coupled to the circuits of LCD panels to protect TFT or other components from ESD events. At the end of the manufacturing process, the ESD protection devices are removed from the substrates to re-establish the separation of the signal lines. Therefore, it is reasonable to consider the jump lines 20 part of the ESD protection formed on the substrates. As the signal lines 10 shown in FIGS. 3 and 4, areas above the dotted lines 30 are the sacrifice areas. After the test is completed, the sacrifice areas with the jump lines 20 on the substrate are removed and signal lines separate.

A testing device 40 (such as an LCD array tester 41) is used for LCD testing. The testing device has a plurality of first probe tips respectively coupled to the gate lines, and a plurality of second probe tips respectively connected to the signal lines in the signal-line groups coupled by the jump lines 20 in FIG. 3. As shown in FIG. 3, the optimum locations for the probe tips to be in contact with the signal lines in the signal-line groups are pads 3 on the panel 50 (as the touching point 31 shown in FIG. 3). By contacting one pad 3 corresponding to a signal line 10 of a signal-line group, the testing device tests both pixel units corresponding to one of the gate lines 4 and the signal lines in a signal-line group. If the panel has m gate lines $G_i$~$G_m$ and n signal lines $P_j$~$P_n$ (thus m×n pixel units on the junctions of the gate lines and the signal lines), the testing device will sequentially and respectively transmit the testing signals to the gate lines $G_i$~$G_m$ through the first probe tips. With respect to each tested gate line $G_i$ (1<i<m), the testing device sequentially transmits the testing signals to signal lines ($P_p$, $P_q$)(1<p, q<n) of the signal lines $P_i$~$P_n$ in each signal-line group, and receives the feedback signals from the signal lines ($P_p$, $P_q$) in each signal-line group. If any signal lines are not assigned to the signal-line groups, the pixel units on the unassigned signal lines are sequentially tested with one of the first probe tips and one of the second probe tips respectively. The test should continue until all of the m×n pixels are tested.

During the test, if neither pixel in a signal-line group is defective, the feedback signal of the signal-line group will be about the same as that of a single signal line 10 of a non-defective pixel. If, however, one or both of the pixels in the tested signal-line group are defective, the feedback signal of the signal-line group will be different from that of a single non-defective one. The defective pixel or pixels are identified using an optical apparatus such as an electronic microscope 42 having a scope covering two pixel units.

The arrangement of the signal-line groups should be well considered so that the two following points are satisfied: (1) the intervals between the second probe tips corresponding to the signal-line groups are the same. For example, as shown in FIG. 3, the intervals between the contacting points 31 are OLB3, and (2) the jump lines 20 should be kept short to make the manufacturing process easier.

Three methods for arranging the signal lines in the signal-line groups are proposed in the following:

(1) The First Method (as shown in FIG. 3):denoting the signal lines as $P_l$~$P_n$, and coupling the signal lines $P_{6i+j}$ and $P_{6i+j+3}$ as a signal-line group, wherein i and j are integers, and 0≦i≦n/6, 1≦j≦3.

(2) The Second Method (as shown in FIG. 2):denoting the signal lines as $P_l$~$P_n$, coupling the signal lines $P_{2i+1}$ and $P_{2i+2}$ to become a signal-line group, wherein i is an integer, and 0≦i≦n/6, 1≦j≦3.

Figure 5:
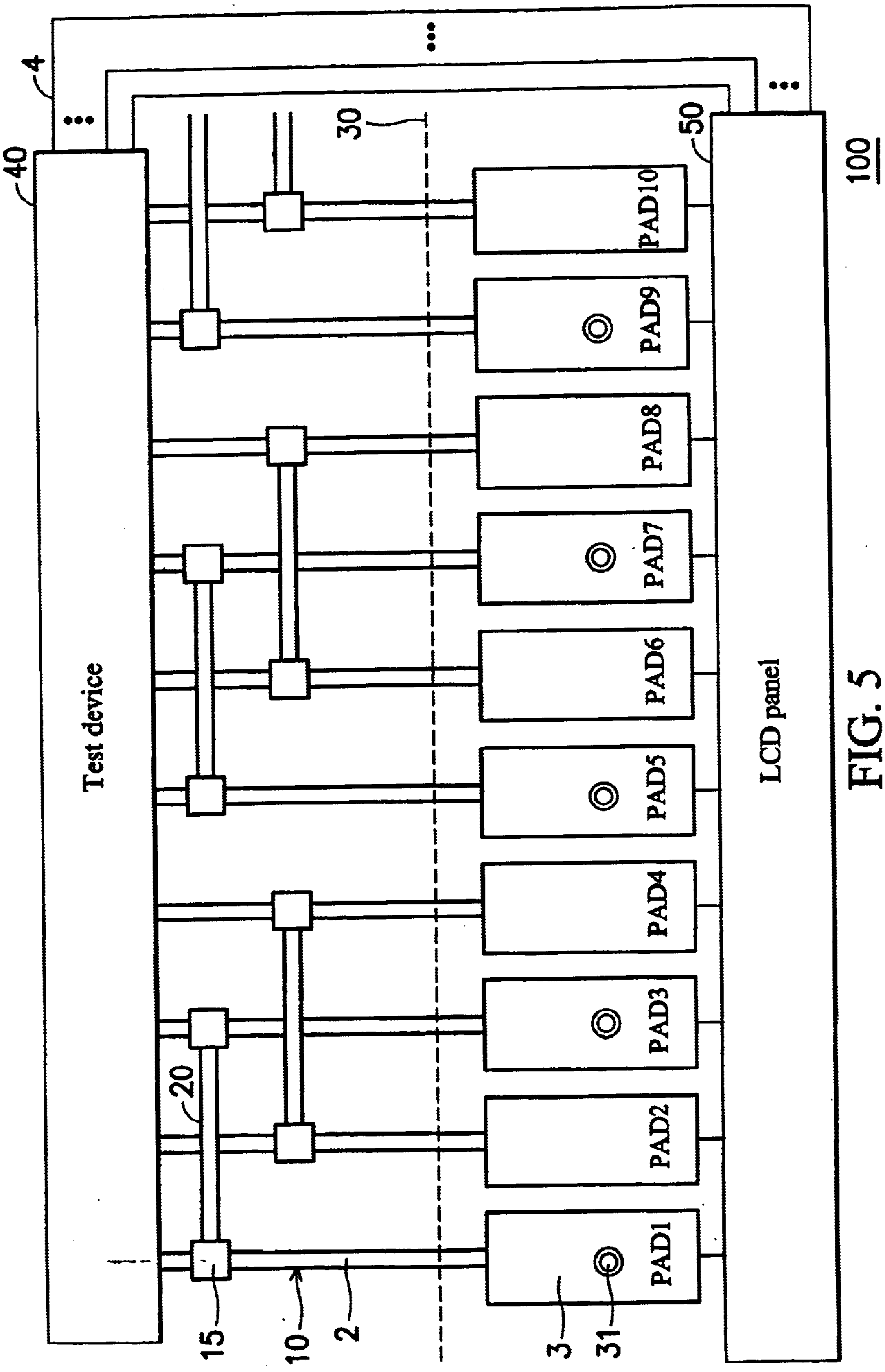
FIG. 5 shows the first embodiment of the configuration of the signal lines according to the present invention.

(3) The third method (as shown in FIG. 5):denoting the signal lines as $P_l$~$P_n$, coupling the signal lines $P_{4i+j}$ and $P_{4i+j+2}$ into a signal-line group, wherein i and j are integers, and 0≦i≦n/4, 1≦j≦2.

In the method described, two signal lines are coupled as a signal-line group by the jump lines 20. However, in order to meet increasing productivity, more signal lines are coupled into a signal-line group. If any of the signal lines $P_l$~$P_n$ are not assigned to the signal-line groups, the pixel units on the unassigned signal lines are sequentially and respectively tested with one of the first probe tips and one of the second probe tips.

Referring to the methods proposed in the present invention, the number of the probe tips of the testing device (such as the array tester) and the tests carried out are halved. The size of the probe tips is less restrictive due to the interval hereinabove. The yield is substantially increased due to the testing time reduction.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An LCD panel testing method, used to test a plurality of pixel units in an LCD panel having a plurality of corresponding gate lines and n signal lines Pi~$P_n$ the method comprising:

providing a substrate;

providing an LCD panel on the substrate, having the signal lines Pi~$P_n$ sequentially arranged on one side of the LCD panel;

dividing the signal lines Pi~$P_n$ to form a plurality of signal-line groups, each signal-line group comprising at least two of the signal lines connected together by a jump line;

providing a sacrifice area on the substrate to couple the signal lines in the signal-line groups, wherein the jump line is formed in the sacrifice area and is formed together with the LCD panel on the substrate by sequentially lithography and etching; and providing a testing device, having a plurality of first probe tips and a plurality of second probe tips, wherein the first probe tips are respectively coupled to the gate lines, and the second probe tips are respectively coupled to the signal-line groups so that the testing device sequentially test the pixel units corresponding to one of the gate lines and one of the signal-line groups.

2. The method in claim 1 further comprising:

trimming off the sacrifice area from the substrate to separate the signal lines after the testing device has finished testing all the pixel units.

3. The method in claim 2 further comprising:

sequentially testing the pixel units on the unassigned signal lines with one of the first probe tips and one of the second probe tips if any of the signal lines are not assigned to the signal-line groups.

4. The claim in claim 3, wherein the step of dividing the signal lines $P_i$~$P_n$ into a plurality of signal-line groups comprises: assigning the signal lines $P_{6i+j}$ and $P_{6i+j+3}$ into a signal-line group, wherein i and j are integers, and 0 i≦n/6, 1≦j≦3.

5. The method in claim 3 wherein the step of dividing the signal lines $P_i$~$P_n$ into a plurality of signal-line groups comprises: assigning the signal lines $P_{2i+1}$ and $P_{2i+1}$ into a signal-line group, wherein i is an integer, and 0≦i≦n/6, 1≦j≦3.

6. The method in claim 3, wherein the step of dividing the signal lines $P_i$~$P_n$ into a plurality of signal-line groups comprises: assigning the signal lines $P_{4i+j}$ and $P_{4i+j+2j}$ into a signal-line group, wherein i and j are integers and 0≦i≦n/4, 1≦j≦2.

7. The method in claim 3, wherein the testing device comprises an LCD array tester.

8. The method in claim 3, wherein the testing device comprises an electronic microscope.

* * * * *